United States Patent
Jiang et al.

(10) Patent No.: US 8,603,847 B2
(45) Date of Patent: Dec. 10, 2013

(54) INTEGRATION OF CURRENT BLOCKING LAYER AND N-GAN CONTACT DOPING BY IMPLANTATION

(75) Inventors: Tao Jiang, Xi'an Shaanxi (CN); Chi-Chun Chen, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 143 days.

(21) Appl. No.: 13/351,039

(22) Filed: Jan. 16, 2012

(65) Prior Publication Data
US 2013/0181186 A1 Jul. 18, 2013

(51) Int. Cl.
*H01L 21/00* (2006.01)
*H01L 29/06* (2006.01)

(52) U.S. Cl.
USPC .................. 438/45; 438/46; 257/13; 257/94

(58) Field of Classification Search
USPC ........... 438/39, 46, 47, 45; 257/13, 94, 98, 99
See application file for complete search history.

(56) References Cited

U.S. PATENT DOCUMENTS

| | | | |
|---|---|---|---|
| 5,663,581 A | 9/1997 | Holm et al. | |
| 6,583,443 B1 * | 6/2003 | Chang et al. | 257/79 |
| 6,998,642 B2 * | 2/2006 | Lin et al. | 257/79 |
| 7,078,256 B2 * | 7/2006 | Ryu et al. | 438/39 |
| 7,612,362 B2 * | 11/2009 | Komada | 257/13 |
| 7,709,281 B2 * | 5/2010 | Matsumura | 438/22 |
| 7,737,456 B2 * | 6/2010 | Song et al. | 257/98 |
| 8,084,281 B2 * | 12/2011 | Shibata et al. | 438/22 |
| 2011/0244616 A1 | 10/2011 | Yu et al. | |
| 2011/0263054 A1 | 10/2011 | Yu et al. | |

OTHER PUBLICATIONS

Shi, Jin-Wei, et al., Visible and Infrared Light-Emitting Diodes Provide Stable Broadband Output, SPIE, 2007, pp. 1-4, 10.1117/2.1200708.0695, SPIE.

\* cited by examiner

*Primary Examiner* — Kevin M Picardat

(57) ABSTRACT

An improved method of fabricating a semiconductor light emitting diode (LED) is disclosed. The current blocking layer and the contact area for the n-type layer are implanted at the same time. In some embodiments, a dopant, which may be an n-type dopant, is implanted into a portion of the p-type layer to cause that portion to become either u-type or n-type. Simultaneously, the same dopant is implanted into at least a portion of the exposed n-type layer to increase its conductivity. After this implant, the dopant in both portions of the LED may be activated through the use of a single anneal cycle.

17 Claims, 6 Drawing Sheets

US 8,603,847 B2

INTEGRATION OF CURRENT BLOCKING LAYER AND N-GAN CONTACT DOPING BY IMPLANTATION

FIELD

This invention relates to ion implantation of light emitting diodes (LEDs) and, more particularly, to ion implantation of LEDs to affect current spreading and contact doping.

BACKGROUND

LEDs are built on a substrate and are doped with impurities to create a p-n junction. A current flows from the p-side, or anode, to the n-side, or cathode, but not in the reverse direction. Electrons and holes flow into the p-n junction from electrodes with different voltages. If an electron meets a hole, it falls into a lower energy level and releases energy in the form of a photon. The wavelength of the light emitted by the LED and the color of the light may depend on the band gap energy of the materials forming the p-n junction.

FIG. 1 is a cross-sectional side view of an embodiment of a p-side up lateral LED. The LED 100 has an n-type layer 103 disposed on the substrate 104. A multiple quantum well (MQW) 102 is disposed on the n-type layer 103 and the p-type layer 101 is disposed between the MQW 102 and a transparent-conductive layer (TCL) 113.

One or more p electrodes 121 are disposed on the TCL 113. Additionally, one or more n electrodes 106 are disposed on the n-type layer 103. This LED 100 may be mounted on a metal alloy in one instance. The p-type layer 101 and n-type layer 103 may be, for example, GaN. The MQW 104 may be GaInN or AlGaInP.

One shortcoming of this configuration is that the current preferably flows directly toward the n electrodes 106, as shown by arrows 109. This means that light is generated in areas within the LED which are blocked by the p electrodes 121. Electrodes, such as the p electrodes 121, may be fabricated of metal and this metal may not be an efficient transparent material for light. Therefore, most light generated in the MQW 102 beneath the p electrode 121 will be reflected and eventually absorbed inside the LED 100. This causes the input current versus light extraction ratio to be reduced, thereby reducing efficiency.

To overcome this shortcoming, a current blocking layer (CBL) may be used. The current blocking layer is disposed beneath the p electrode 121 to block current flow from the p electrode 121 to the p-type layer 101. FIG. 2A shows a first embodiment of a CBL 114. The CBL 114 is disposed above the p-type layer 101, and forces the current to spread to either side of the CBL 114, thereby reducing the amount of light that is generated directly beneath the p electrode. In some embodiments, the CBL 114 material is an insulating material such as $SiO_2$, $Si_3N_4$ or undoped GaN. This material may be deposited on the surface of the LED 100, such as on the p-type layer 101, using a mask to allow deposition only in the desired location. In another embodiment, the insulating material is deposited on the entire surface of the p-type layer 101, and the unwanted material is then removed using a dry or wet etch process.

In another embodiment, shown in FIG. 2B, the CBL 114 is created by implanting ions 119 into the p-type layer 101 to create CBL 114. For example, argon or nitrogen may be implanted to create the non-conductive region represented by CBL 114. Typically, a mask 116 is used to only allow the ions 119 to be implanted in the region where the CBL 114 is desired.

The use of a CBL 114 maximizes the amount of light that is produced which ultimately will be emitted outside of the LED 100.

Unfortunately, the creation of the CBL 114 often requires additional process steps, which result in decreased throughout and increased cost. Therefore, it would be advantageous if the creation of the CBL 114 could be combined, or integrated with another process step to reduce manufacturing time and increase throughout.

SUMMARY

An improved method of fabricating a semiconductor LED is disclosed. The CBL and the contact area for the n-GaN region are implanted at the same time. In some embodiments, a dopant, which is an n-type dopant in GaN, is implanted into a portion of the p-type layer to cause that portion to become either u-type or n-type GaN. Simultaneously, the same dopant is implanted into at least a portion of the exposed n-type layer to increase its conductivity. After this implant, the dopant in both portions of the LED may be activated through the use of a single anneal cycle.

BRIEF DESCRIPTION OF THE DRAWINGS

For a better understanding of the present disclosure, reference is made to the accompanying drawings, which are incorporated herein by reference and in which.

DETAILED DESCRIPTION

The method is described herein in connection with ion implantation of LEDs. However, the method can be used with other semiconductor manufacturing processes. A beam-line ion implanter, plasma doping ion implanter, or other ion implantation system known to those skilled in the art may be used in the embodiments described herein. Thus, the invention is not limited to the specific embodiments described below.

Figure 1:
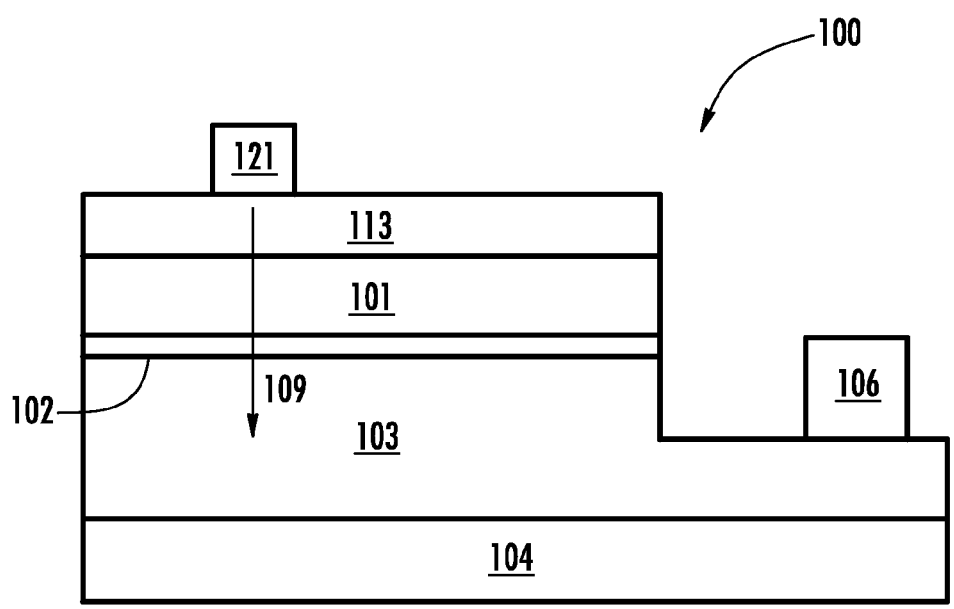
FIG. 1 is a cross-sectional side view of the vertical LED structure of the prior art.
Figure 2A:
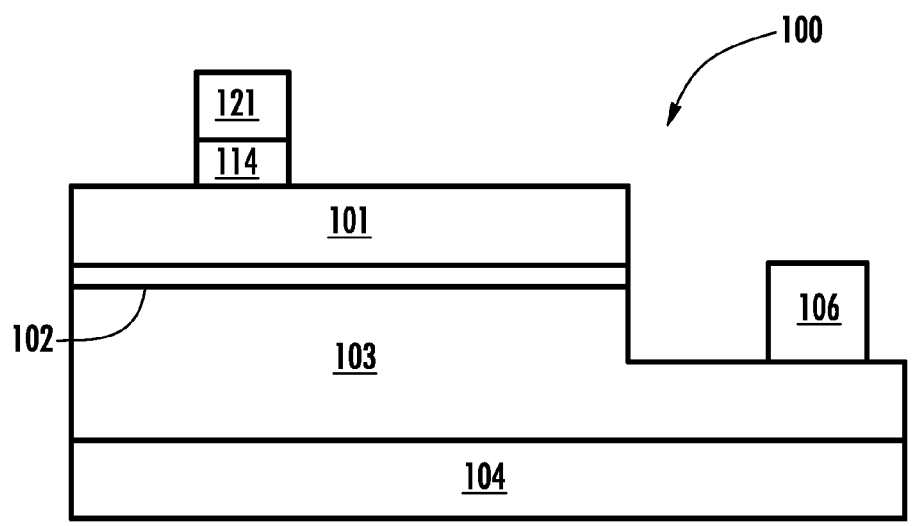
FIG. 2A is a cross-sectional side view of a vertical LED structure having a CBL according to one embodiment in the prior art.
Figure 2B:
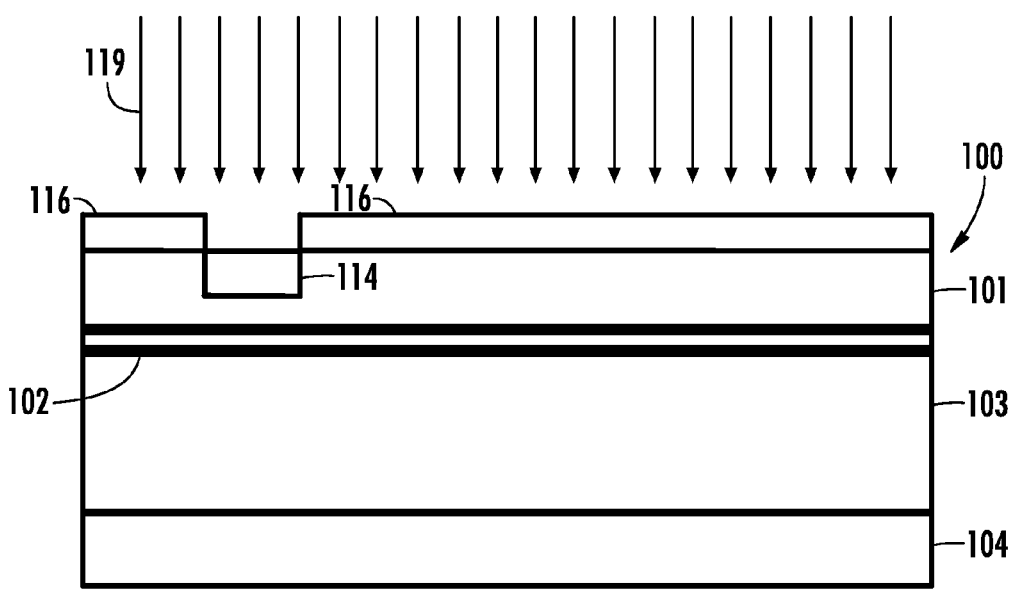
FIG. 2B is a cross-sectional side view of the vertical LED structure having a CBL according to a second embodiment in the prior art.
Figure 3:
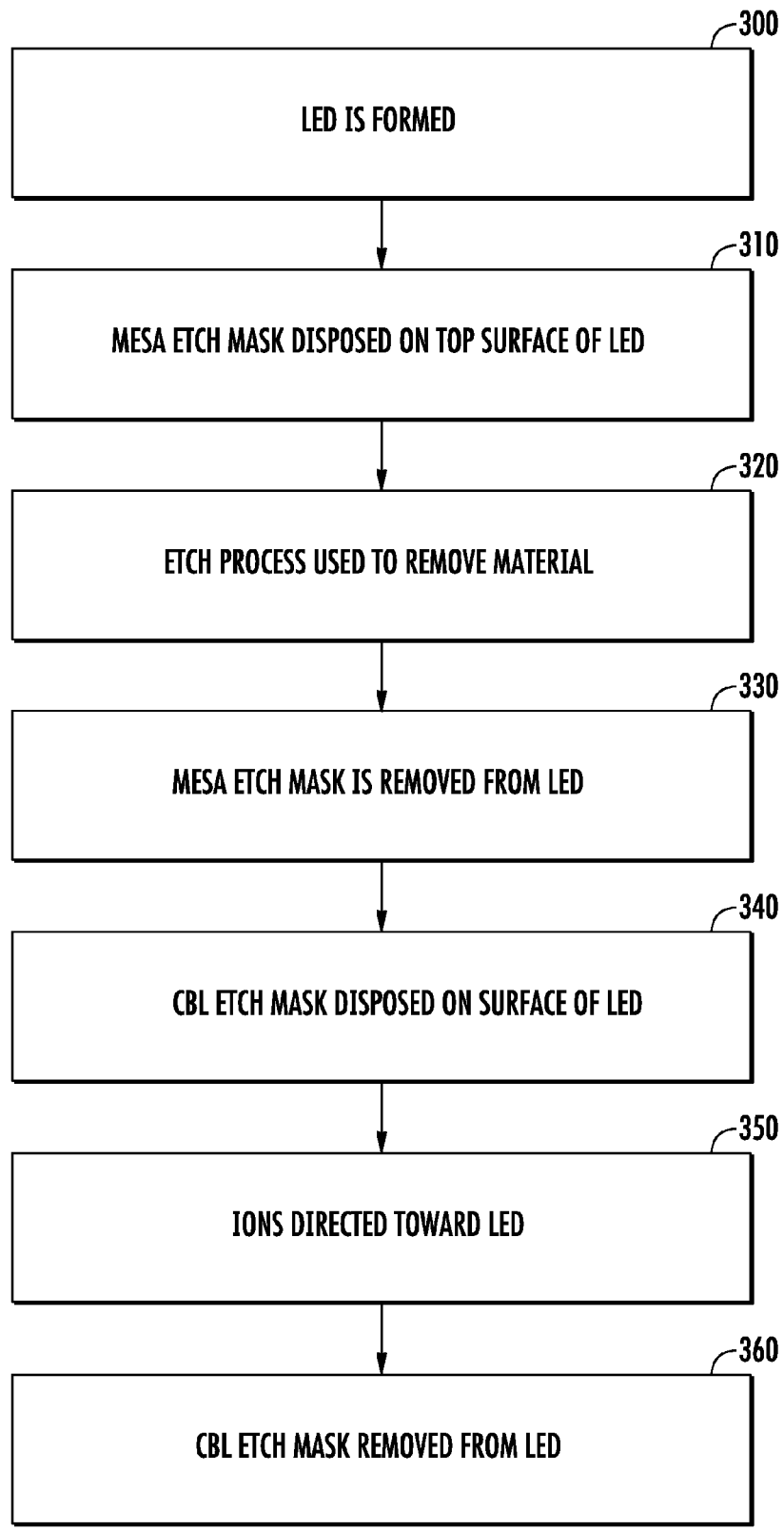
FIG. 3 is a flowchart showing the processing steps used to manufacturing the LED according to one embodiment.

FIG. 3 is a flowchart showing the sequence of processing steps that may be used to create the LED of the present disclosure. It should be realized that additional process steps may be added without departing from the spirit of the disclosure.

FIGS. 4A-H show a sequence of cross-sectional views of a LED that correspond to the processing steps described in FIG. 3. As stated above, these process steps advantageous combine the creation of the CBL with the doping of the n-GaN contact region.

Figure 4:
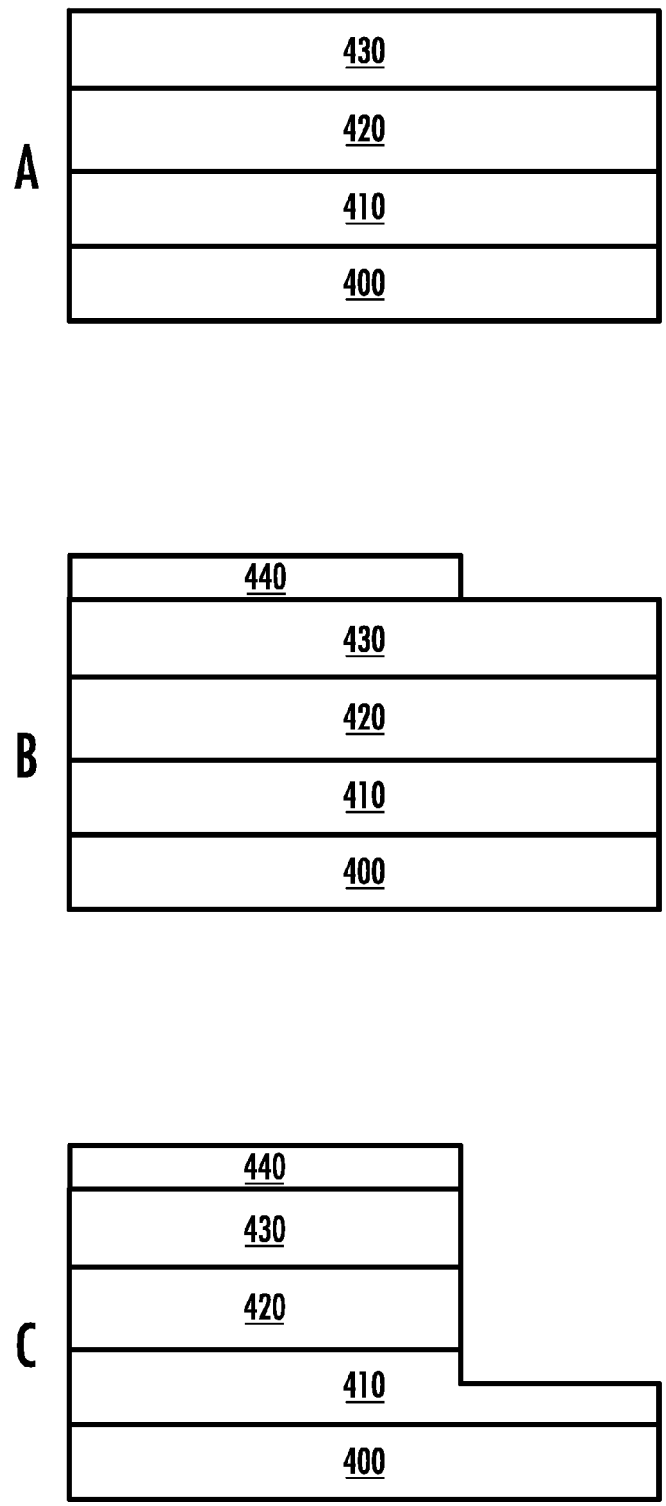
FIGS. 4A-H are cross-sectional side views of the LED during each of the processing steps according to one embodiment.
Figure 4:
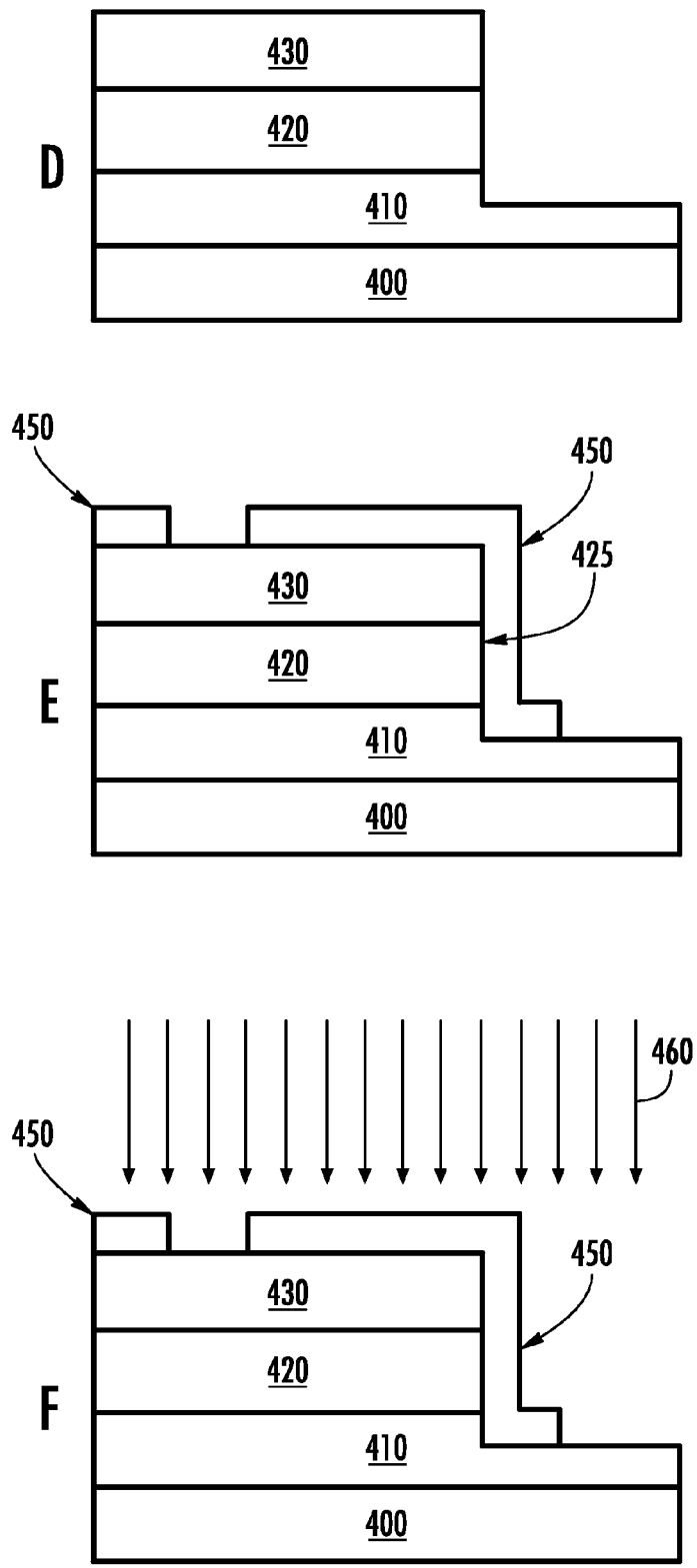
Figure 4:
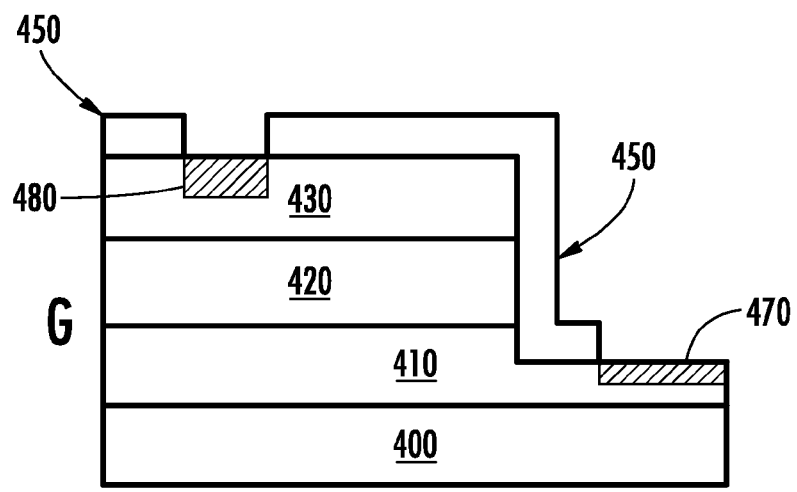
Figure 4:
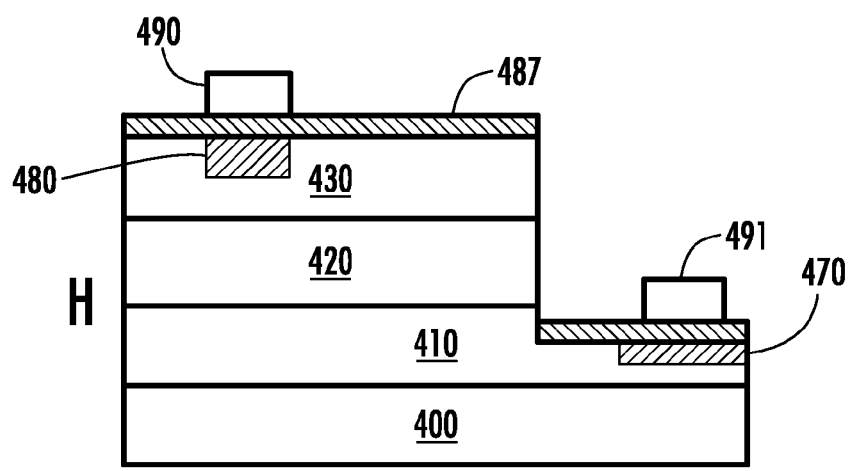

Referring to FIGS. 3 and 4A, a LED is formed in step 300. The LED has at least a p-type layer 430 disposed on a MQW 420. The MQW 420 is disposed on an n-type layer 410, which in turn is disposed on a substrate 400. Various methods of creating such a LED are well known and will not be described herein. The p-type layer 430 and n-type layer 410 may be, for example, GaN, InGaN or AlGaInP. In some embodiments, a TCL is added on top of the p-type GaN layer 430. FIG. 4A is a cross-sectional side view of such a LED structure.

A mesa etch mask 440 is disposed on the top surface of the LED structure, as shown in step 310. In some embodiments, the etch mask 440 is disposed on a portion of the p-type GaN layer 430, as shown in FIG. 4B. In one embodiment, a photoresist or hard mask such as $SiO_2$ may be deposited on top of the LED surface as the etch mask 440. A portion of this photoresist or hard mask is then removed to form the mesa window. In other embodiments, the etch mask 440 is disposed on the TCL, which is disposed on the p-type layer 430.

An inductively coupled plasma (ICP) etch process is performed, as shown in step 320. This etch may be, for example, a dry reactive ion etch (RIE). In other embodiments, a different etch process may be utilized, such as a wet etch using a KOH solution. The mesa etch mask 440 is used to protect a portion of the LED structure, while material from another portion of the LED structure is removed to expose the n-type GaN 410. In other words, a portion of the p-type GaN layer 430 and the MQW 420 are removed, as shown in FIG. 4C. Some of the n-type GaN 410 also may be removed during the etch.

The mesa etch mask 440 is then removed, as shown in step 330. At this point, a portion of the n-type GaN layer 410 is exposed, as is the p-type GaN layer 430, as shown in FIG. 4D.

A CBL mask 450 is then deposited on the LED structure, as shown in step 340. As best seen in FIG. 4E, the CBL mask 450 has at least one opening disposed in the p-type GaN layer 430 and at least one opening disposed in the n-type GaN layer 410. In some embodiments, the CBL mask 450 is deposited on the vertical sidewall 425 to prevent the implantation of ions in this area. In one embodiment, a photoresist or other mask material is deposited on the exposed top surface. An opening in the p-type GaN layer 430 and an opening in the n-type GaN layer 410 may be made using an etching process.

Ions 460 are then directed toward the LED structure, as shown in step 350. The ions 460 only implant those portions of the LED structure without the CBL mask 450, as shown in FIG. 4F. The ions 460 used for this implant operate as an n-type dopant in the GaN layers. These ions thus serve to eliminate or reverse the conductivity of the implanted region in the p-type GaN layer 430. In other words, the ions 460 change the implanted region into a u-type or n-type GaN region. Those ions 460 also implant the n-type GaN layer 410 and serve to increase the conductivity of the implanted region in that layer.

In other words, a single ion implantation serves to create two regions in the LED, a first region, which serves as a CBL 480, in the p-type layer 430 and a second region, which is a highly conductive contact region 470, in the n-type layer 410, as shown in FIG. 4G. Highly conductive contact region 470 serves to improve n-type GaN contact resistance, which reduces the forward voltage of the LED. In some embodiments, the ions 460 are silicon ions, although other species may also be used.

The use of silicon for the ion implant has several benefits. The use of silicon to form the u-type or n-type GaN CBL 480 in the p-type GaN 430 reduces the light absorption caused by material damage. Silicon atoms are larger than nitrogen atoms, but are smaller than argon atoms. Therefore, it may create more damage than nitrogen implantation and less damage than argon implantation. However, silicon induced damage can be much easier recovered by annealing, as compared with argon and nitrogen, in general. Thus, silicon can achieve the benefit from light absorption by reducing material damage via an anneal process while nitrogen and argon cannot achieve this result, even with added annealing. In addition, the creation of a region having u-type or n-type conductivity creates a p-n junction under the electrode. This makes use of the depletion layer in the p-n junction to block lateral current spreading under the CBL 480.

As shown in step 360, the CBL mask 450 is then removed. The completed LED substrate is shown in FIG. 4H. After this processing step, other steps may be performed. In some embodiments, a TCL 487 is deposited on the exposed surfaces at this time.

After the implanted regions 470, 480 are created, the p electrode 490 is added to the LED. In some embodiments, silver is applied to the p-type GaN layer 430. Subsequent layers of metal, such as silver, can be applied using evaporation or electroplating. In operation, current travels through the p electrode 490 and then distributes laterally through the TCL 487 around the CBL 480. The n electrode 491 can be added on contact region 470 using the same technique.

In addition, after the implanted regions 470, 480 are created, the regions may be activated through the use of a single anneal cycle.

While a CBL mask 450 is illustrated on the LED, other mechanisms for selectively implanting ions may also be used. For example, a stencil or shadow mask that is disposed a distance upstream of the LED may be utilized. In another embodiment, a selective implant system that does not use a mask (such as a focused ion beam) also may be used.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of fabricating a light emitting diode (LED), comprising:
   creating a structure having a n-type layer, a multi-quantum well (MQW) on said n-type layer, and a p-type layer on said MQW, where a portion of said n-type layer is exposed;
   simultaneously selectively implanting ions into a first region of said p-type layer to reduce conductivity in said first region and into a second region of said n-type layer to increase conductivity in said second region;
   applying a p electrode to said p-type layer; and
   applying an n electrode to said portion of said n-type layer.

2. The method of claim 1, wherein said ions comprise an n-type dopant.

3. The method of claim 2, wherein said ions comprise silicon.

4. The method of claim 1, wherein said creating step comprises:
   growing said n-type layer on a substrate;
   growing said MQW on said n-type layer;
   growing said p-type layer on said MQW;

disposing a mask on said p-type layer that defines an opening configured to leave a portion of said p-type layer exposed;

performing an etching process of said portion of said p-type layer, such that said portion of said p-type layer and said MQW beneath said portion of said p-type layer are removed, thereby exposing said portion of said n-type layer.

5. The method of claim 1, wherein said LED comprises a vertical sidewall, and said method further comprises disposing a mask on said vertical sidewall prior to said selective implanting.

6. The method of claim 1, further comprising depositing a transparent coating layer on a top surface of said LED prior to applying said p electrode and said n electrode.

7. The method of claim 1, further comprising performing an anneal cycle after said selectively implanting said ions into said first region and said second region.

8. A light emitting diode, comprising:
a structure having a n-type layer, a multi-quantum well (MQW) on said n-type layer, and a p-type layer on said MQW, where a portion of said n-type layer is exposed;
a p electrode on said p-type layer;
an n electrode on said portion of said n-type layer;
a region of reduced conductivity disposed in said p-type layer beneath said p electrode; and
a region of increased conductivity disposed in said portion of said n-type layer beneath said n electrode;
wherein said region of reduced conductivity and said region of increased conductivity both comprise one species of implanted ions.

9. The light emitting diode of claim 8, wherein said one species comprises silicon.

10. The light emitting diode of claim 8, further comprising a transparent coating layer disposed on a top surface of said light emitting diode beneath said p electrode and said n electrode.

11. A light emitting diode made by a process comprising:
creating a structure having a n-type layer, a multi-quantum well (MQW) on said n-type layer, and a p-type layer on said MQW, where a portion of said n-type layer is exposed;
simultaneously selectively implanting ions into a first region of said p-type layer to reduce conductivity in said first region and into a second region of said n-type layer to increase conductivity in said second region;
applying a p electrode to said p-type layer; and
applying an n electrode to said portion of said n-type layer.

12. The light emitting diode of claim 11, wherein said ions comprise an n-type dopant.

13. The light emitting diode of claim 12, wherein said ions comprise silicon.

14. The light emitting diode of claim 11, wherein said creating step comprises:
growing said n-type layer on a substrate;
growing said MQW on said n-type layer;
growing said p-type layer on said MQW;
disposing a mask on said p-type layer that defines an opening configured to leave a portion of said p-type layer exposed;
performing an etching process of said portion of said p-type layer, such that said portion of said p-type layer and said MQW beneath said portion of said p-type layer are removed, thereby exposing said portion of said n-type layer.

15. The light emitting diode of claim 11, wherein said LED comprises a vertical sidewall, and said process further comprises disposing a mask on said vertical sidewall prior to said selective implanting.

16. The light emitting diode of claim 11, wherein said process further comprises depositing a transparent coating layer on a top surface of said light emitting diode prior to applying said p electrode and said n electrode.

17. The light emitting diode of claim 11, wherein said process further comprises performing an anneal cycle after said selectively implanting said ions into said first region and said second region.

\* \* \* \* \*